United States Patent
Besser et al.

[11] Patent Number: 5,970,370
[45] Date of Patent: Oct. 19, 1999

[54] MANUFACTURING CAPPING LAYER FOR THE FABRICATION OF COBALT SALICIDE STRUCTURES

[75] Inventors: Paul R. Besser, Sunnyvale; Robin W. Cheung, Cupertino, both of Calif.; Robert Chen, Hsinchu, Taiwan

[73] Assignee: Advanced Micro Devices, Sunnyvale, Calif.

[21] Appl. No.: 09/208,597

[22] Filed: Dec. 8, 1998

[51] Int. Cl.$^6$ ................................................ H01L 21/28
[52] U.S. Cl. .................. 438/586; 438/655; 438/664; 438/683; 438/902
[58] Field of Search .................... 438/630, 649, 438/651, 655, 664, 682, 683, 902, 586, 592; 257/384, 757, 768, 769

[56] References Cited

U.S. PATENT DOCUMENTS

| | | | |
|---|---|---|---|
| 5,047,367 | 9/1991 | Wei et al. | 438/607 |
| 5,231,053 | 7/1993 | Bost et al. | 437/190 |
| 5,266,156 | 11/1993 | Nasr | 156/656 |
| 5,317,187 | 5/1994 | Hindman et al. | 257/659 |
| 5,567,651 | 10/1996 | Berti et al. | 438/303 |
| 5,582,881 | 12/1996 | Besser et al. | 427/576 |
| 5,593,924 | 1/1997 | Apte et al. | 437/200 |
| 5,780,362 | 7/1998 | Wang et al. | 438/683 |
| 5,874,342 | 2/1999 | Tsai et al. | 438/301 |
| 5,902,129 | 5/1999 | Yoshikawa et al. | 438/592 |

FOREIGN PATENT DOCUMENTS

| | | |
|---|---|---|
| 0 525 637 A1 | 2/1993 | European Pat. Off. |
| 0 598 422 A1 | 5/1994 | European Pat. Off. |
| 0 651 076 A1 | 5/1995 | European Pat. Off. |

OTHER PUBLICATIONS

Yamazaki, T., et al., "21 psec switching 0.1$\mu$m–CMOS at romm temperature using high performance Co salicide process", IEEE IEDM Tech. Digest, Dec. 1993, pp. 906–908, Dec. 1993.

Goto, K., et al., "Leakage mechanism and optimized conditions of Co salicide process for deep–submicron CMOS devices", IEEE IEDM Tech. Digest, Dec. 1995, pp. 449–452.

Tung, R., et al., "Increased uniformity and thermal stability of CoSi$_2$ thin films by Ti capping", Appl. Phys. Lett., 67(15), Oct. 9, 1995, pp. 2164–2166.

*Primary Examiner*—T. N. Quach
*Attorney, Agent, or Firm*—LaRiviere, Grubman & Payne, LLP

[57] ABSTRACT

An improved process for manufacturing cobalt silicide layers uses two capping layers. A first capping layer of titanium nitride prevents the formation of a cobalt/titanium intermetallic. A subsequently formed titanium metallic layer getters impurities from outgassing and the ambient preventing corruption of the cobalt layer. Two rapid thermal annealing steps convert the cobalt at the cobalt/silicon intermetallic into highly conductive cobalt disilicide. The cobalt silicide does not suffer from linewidth dependent increases in resistivity. Therefore, the cobalt disilicide formed by the present method is useful for semiconductor devices with linewidths and feature sizes less than 0.20 $\mu$m. The process has wide applicability and may be used to fabricate local circuit interconnects, floating gates, double polysilicon stacked floating gates as well as other uses.

29 Claims, 8 Drawing Sheets

MANUFACTURING CAPPING LAYER FOR THE FABRICATION OF COBALT SALICIDE STRUCTURES

BACKGROUND OF PRESENT INVENTION

1. Field of the Invention

This invention relates to the field of self-aligned silicide semiconductor structures, and more specifically, to a process designed to form cobalt disilicide (CoSi$_2$) layers for use in salicide technology.

2. Background & Related Art

In the manufacture of semiconductor devices, silicides, materials formed by the reaction of refractory metals, or near nobel metals, with silicon, are used in a variety of applications. For the past decade titanium silicide (TiSi$_2$), has been the workhorse of the semiconductor industry due to its low contact resistance, low sheet resistance, and well-understood properties. However, as feature sizes and linewidths decrease below the 0.20 µm level, the drawbacks and shortcomings of TiSi$_2$, are becoming apparent and more critical. Thus, the effectiveness of TiSi$_2$ is coming to an end. In the search for an effective replacement numerous alternative materials have been experimented with. One promising replacement material is cobalt disilicide (CoSi$_2$).

One key use of silicides is in the so-called salicide process. Salicide processing is the manufacture of "self-aligned" silicide gate structures. A typical presently used process is shown in FIGS. 1A–1D. FIG. 1A begins with a self-aligned MOS transistor already formed on a silicon substrate. Such a device features a gate structure, 103, formed on an active semiconductor surface region, 101, lying between field oxide regions, 102, of a semiconductor surface. The gate, 103, lies between spacers, 104, and source and drain regions, 105. The gate, 103, typically features an electrode formed from polysilicon. As shown in FIG. 1B, a silicide structures are typically formed by sputtering titanium (Ti), 106, over the entire semiconductor surface in a physical vapor deposition ("PVD") process. The resulting structure is then heated in a first rapid thermal anneal ("RTA1") process. As shown in FIG. 1C, this causes the titanium to react with the polysilicon in gate region, 103g, and also with the silicon of the source and drain regions, 105d. However, titanium deposited in the spacer and field oxide regions, u, does not react to form silicide. Moreover, the reaction between titanium and silicon in the source, 105d, drain, 105d, and gate, 103g, regions is "incomplete". The unreacted titanium, u, is selectively etched from the surface leaving only the "incompletely" reacted titanium silicide in regions, 103g and 105d. The "incompletely" reacted titanium silicide (TiSi$_2$) has a crystallographic structure, known as C49. C49 TiSi$_2$ is an unsatisfactory end product which has high sheet resistance. Titanium silicide requires further processing to obtain the necessary sheet resistance. A second RTA ("RTA2") is performed causing TiSi$_2$ to change phase, forming a low resistance TiSi$_2$, known as C54. C54 TiSi$_2$ has a much lower sheet resistance than C49 and is used as an effective gate contact material.

C54 TiSi$_2$ has many excellent properties, low junction leakage, low sheet resistance, low contact resistance, etc. However, it has been discovered as feature size and linewidth decrease, titanium silicide becomes a less than satisfactory silicide material. It has been observed that titanium silicide suffers from a linewidth dependent increase in sheet resistance. FIG. 2 shows the relationship between linewidth and sheet resistance of TiSi$_2$ and CoSi$_2$. As shown in FIG. 2, as linewidth decreases, the sheet resistance of titanium silicide increases. FIG. 2 shows that as TiSi$_2$ linewidth decreases below 0.17 µm, the sheet resistance of TiSi$_2$ radically increases making it a wholly unsuitable material for the newer generation of microprocessors and memory chips.

Various attempts have been made to extend the life of TiSi$_2$ as a useful process material. This has led to some useful improvements, but due to TiSi$_2$'s grain structure, these improvements appear to be at an end. The chief limitation on TiSi$_2$ is the number of nucleation sites. As linewidth decreases, the number of C54 nucleation sites also decreases leading to difficulties in forming low resistance C54 phase titanium silicide. This key factor has been very difficult to overcome in the present art.

Cobalt has been heralded as a promising possible successor material for titanium. The reason for this is shown in FIG. 2. CoSi$_2$ does not suffer from the linewidth dependent sheet resistance problem. However, CoSi$_2$ is not without its own unique problems. Unlike titanium, cobalt requires that the silicon deposition surfaces be cleaned (i.e., the native oxide layer etched off) prior to cobalt deposition. Furthermore, cobalt's suffers from extreme sensitivity to incorporation of surface and ambient contaminants during rapid thermal annealing (RTA) which makes a capping layer a virtual necessity. A process flow which addresses some of these problems is set forth in U.S. Pat. No. 5,047,367 by Wei, et al.

The invention of Wei describes a process for forming a titanium nitride/cobalt silicide bilayer for use in salicide technology and as contact via fills. Titanium is deposited on a silicon substrate then coated with a thin layer of Co. These layers are annealed in a nitrogen atmosphere. During anneal, cobalt migrates into the silicon substrate and titanium migrates upwards towards the surface. The surface titanium reacts with the atmosphere to form titanium nitride which protects the underlying cobalt layer. The cobalt then reacts with the silicon layer to form cobalt silicide. This method has the advantage of being a simple process which does not require the removal of the native SiO$_2$ layer from the Si wafer surface. Additionally, the Ti layer getters the atmospheric and surface impurities from the Co layer preventing its contamination during processing. However, this process suffers from undesirable formation of a CoTi$_2$ intermediate at the Ti/Co interface which inhibits CoSi$_2$ formation.

Another present art process for fabricating a CoSi$_2$ layer, involves the deposition of a titanium nitride (TiN) capping layer over a cobalt layer. This process begins with a silicon substrate having field oxide regions and spacers in place. The Si surface is stripped of its native oxide, then a layer of Co is formed over the surface. Subsequently, a capping layer of TiN is formed over the metallic cobalt. The substrate is then subject to rapid thermal annealing. This process avoids the formation of CoTi$_2$ by using the TiN cap, which avoids the Ti/Co reaction during processing. However, this process suffers from incomplete reaction of the Co with Si. This incompleteness is more pronounced at narrow linewidths (e.g. less than 0.30 µm) and at intermediate temperatures (e.g. temperatures in the range of 500–600 ° C.). The process also suffers from the effects of oxide outgassing which inhibits silicide formation by slowing Co diffusion.

Another method of forming CoSi$_2$, is the direct formation of a Ti capping layer over the Co layer. Such a process is shown in U.S. Patent No. 5,780,362 by Wang and Maex. The Co layer is formed directly on the semiconductor substrate without stripping the native oxide. Subsequently, a Ti capping layer is formed over the Co layer. Since Ti is an excellent gettering material, the Ti capping layer removes impurities. The Ti layer removes impurities from the RTA ambient, as well as the $SiO_2$ native oxide layer. This allows Co to react freely with the Si substrate. Unfortunately, this method has the same drawbacks as other methods where metallic Ti directly contacts Co, namely, Ti reacts with Co to form $CoTi_2$. This consumes Co and hinders the formation of $CoSi_2$.

What is needed is a method that eliminates the collective drawbacks of the existing techniques and allows the effective formation of a $CoSi_2$ layer. The object of the present invention is to provide an efficient process for forming a CoSi, layer which does not incorporate impurities from the ambient or from surface outgassing. A further object of the present invention is to avoid the formation of undesirable intermediates, such as $CoTi_2$, during processing. A further object of the present invention is to avoid process reactions which induce undue stresses in the substrate causing voiding of spacers.

SUMMARY OF THE INVENTION

The present invention is a method for forming a $CoSi_2$ layer on a semiconductor substrate. The present invention overcomes the problems inherent to pure titanium or titanium nitride capping layers, while reaping the advantages of both, by capping the cobalt layer with a bilayer made of both titanium nitride and titanium. Such a structure is shown in FIG. 4. A metallic cobalt layer, 402, is formed on a silicon substrate, 10. The cobalt layer, 402, is subsequently covered by a layer of titanium nitride, 403, which is then covered with a layer of titanium metal, 404. The titanium nitride cap prevents the formation of a titanium/cobalt intermetallic thereby preventing the consumption of cobalt in a titanium/cobalt reaction. Both the titanium nitride layer, 403, and the titanium metallic layer, 404, may advantageously be formed in the same chamber of a multi-chamber process tool. The use of titanium as a second capping layer also advantageously prevents the contamination of cobalt by impurities present in the RTA ambient or by outgassing species from the oxide.

BRIEF DESCRIPTION OF THE DRAWINGS

For a fuller understanding of the present invention, reference is made to the following drawings. Reference numbers are intended to refer to the same or equivalent parts of the invention throughout the several drawings. In the drawings.

DETAILED DESCRIPTION OF THE INVENTION

The present invention describes a process for forming a polycrystalline cobalt disilicide ($CoSi_2$) layer using a titanium nitride/titanium capping layer. This cobalt disilicide layer is used in self-aligned silicide technology. The present invention advantageously uses the best characteristics of both the titanium nitride layer and the titanium metallic layer. The titanium nitride layer prevents the reaction of the cobalt layer with subsequently formed titanium capping layer. The titanium top layer getters the impurities from the underlying layers as well as the ambient, preventing the contamination of the cobalt layer.

Figure 1A:
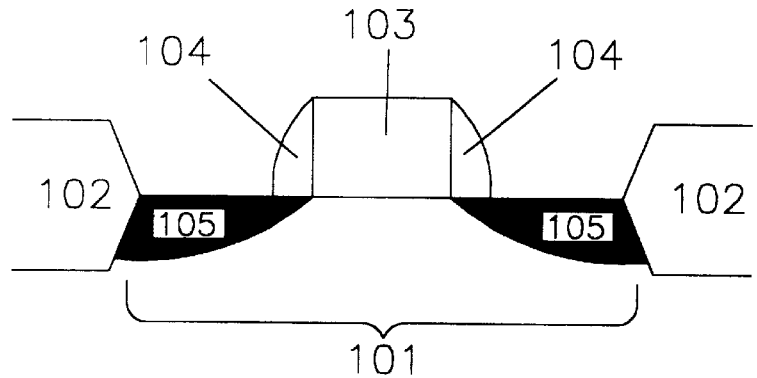
FIGS. 1A through 1D are cross-section views of a semiconductor substrate showing the steps of a prior art salicide process.
Figure 1B:
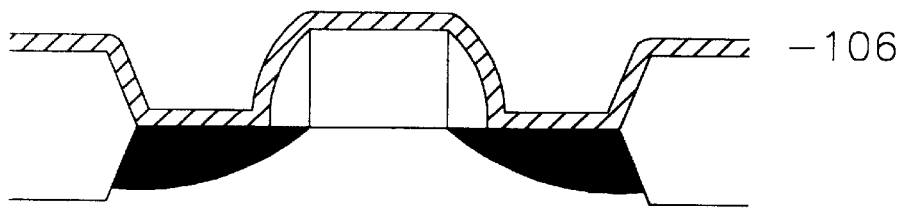
Figure 1C:
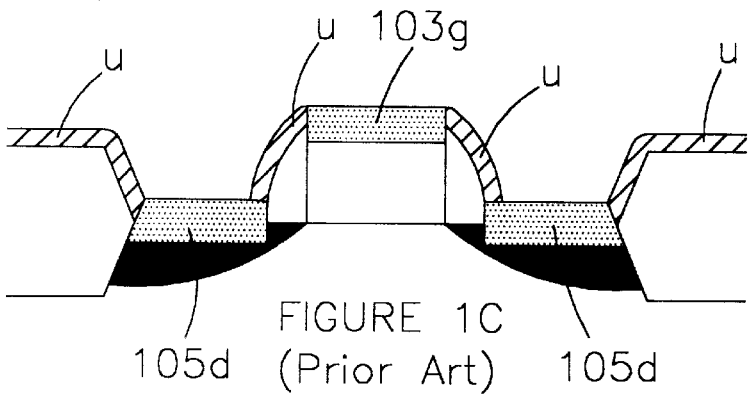
Figure 1D:
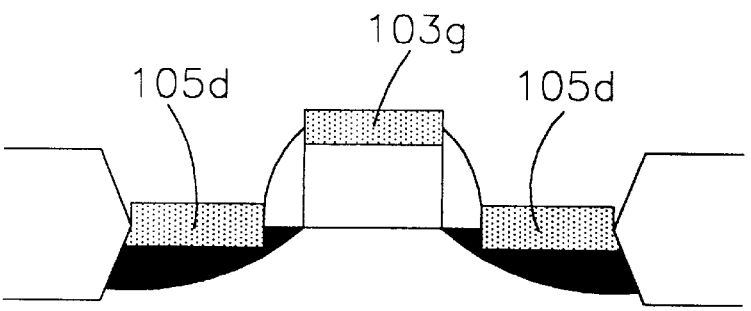
Figure 2:
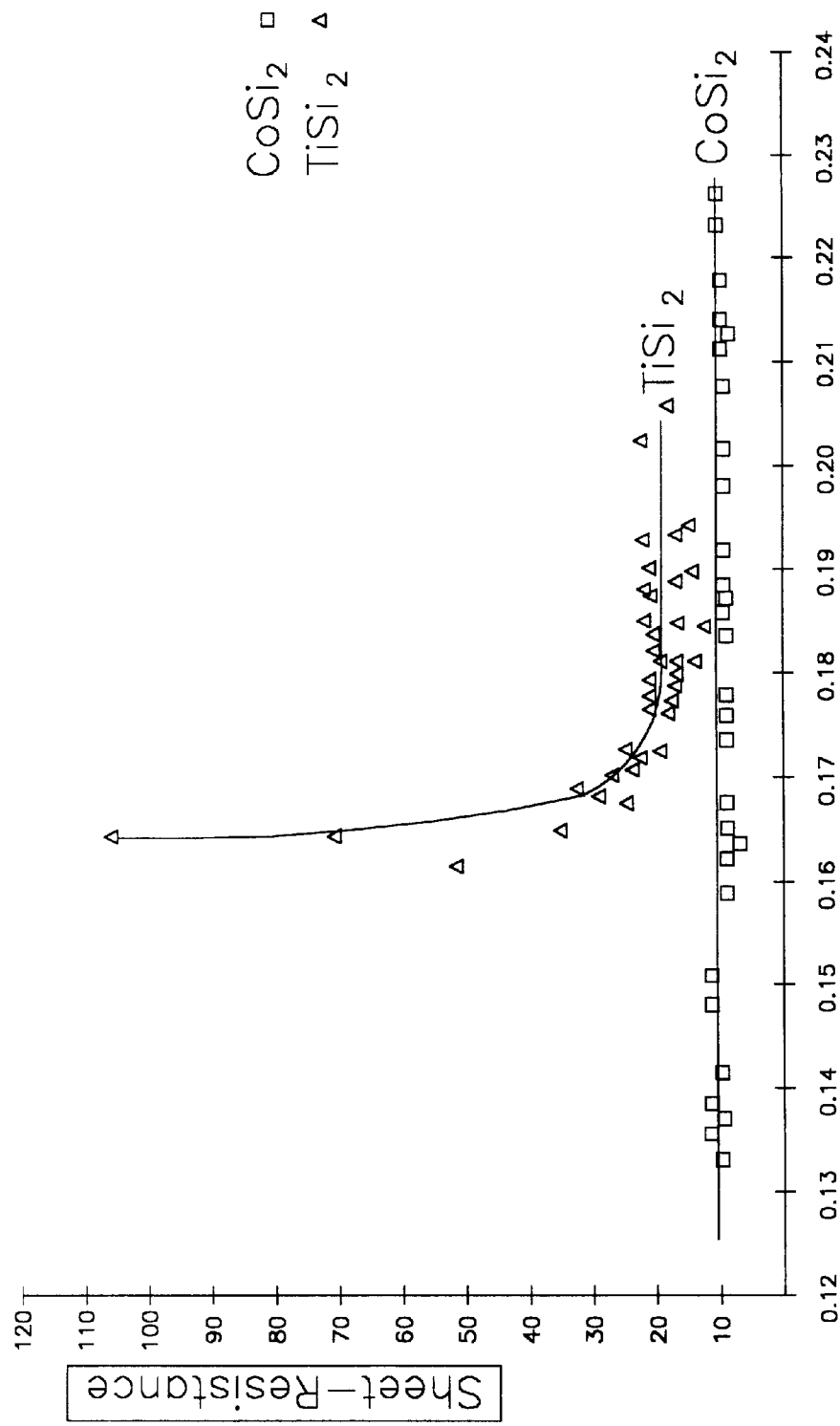
FIG. 2 is a graph of silicide material sheet resistivity versus linewidth.
Figure 3A:
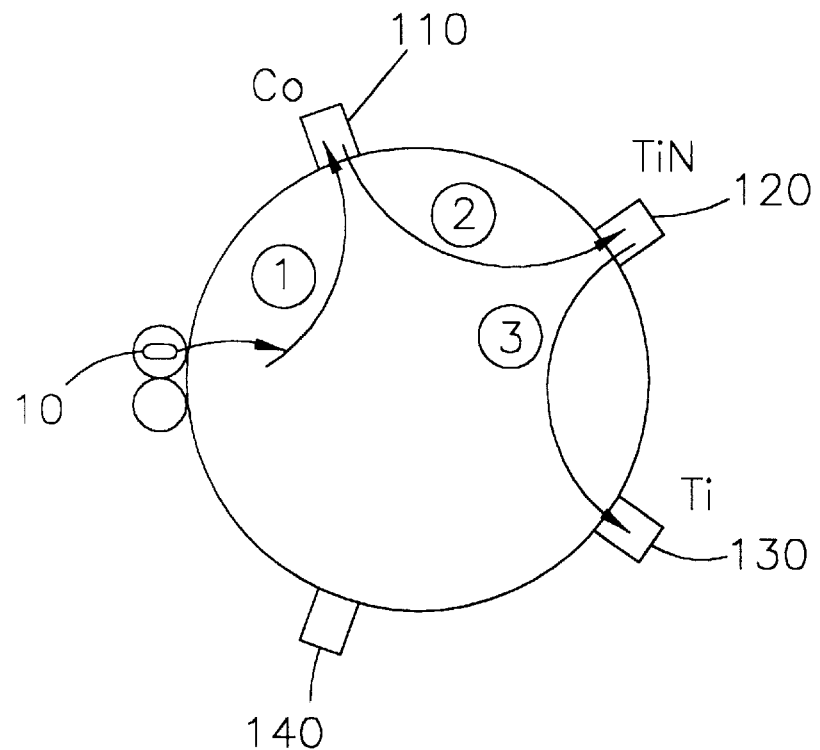
FIGS. 3A & 3B are plan views of multi-chamber process tools used in accordance with the present invention.
Figure 3B:
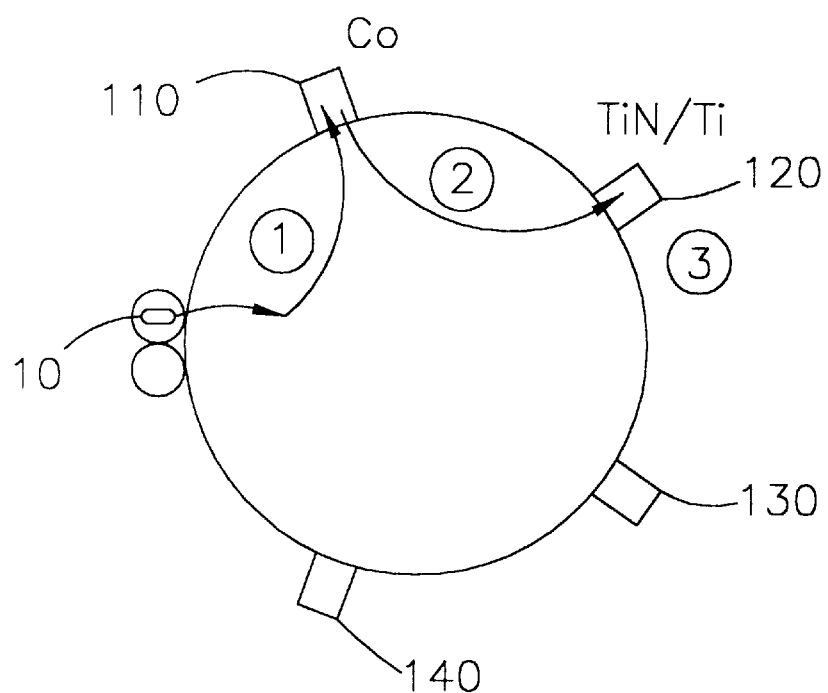
Figure 3C:
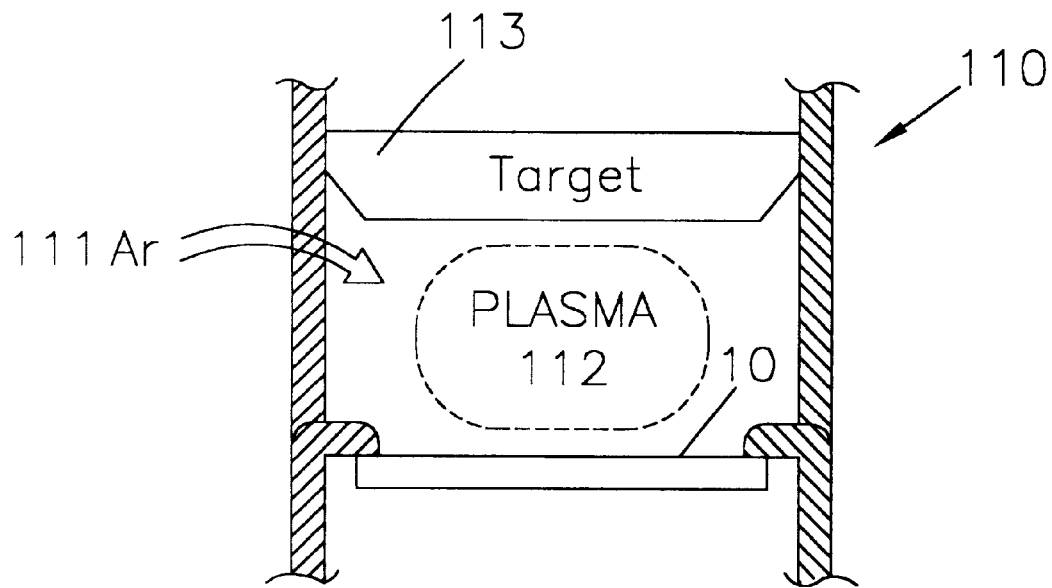
FIGS. 3C & 3D are cross-section views of sputtering chambers where the cobalt, titanium nitride and titanium layers of the present invention are deposited.

The present invention is practiced using commercially available sputtering deposition systems such as those manufactured by Perkin-Elmer for batch processing, and those manufactured by Varian, Anelva, or Applied Materials Technology for single wafer processing. A typical example is an Applied Materials, Inc. Endura 5500 physical vapor deposition ("PVD") system. The process of forming a $CoSi_2$ layer is shown in FIG. 3A. FIG. 3A shows a plan view of a typical multichamber process tool. An exemplar tool features four process chambers (110, 120, 130, & 140). A cross-sectional schematic view of a sputtering chamber, 110, is shown in FIG. 3C. Referring to FIG. 3A, in Step 1, a silicon substrate, 10, is moved into the chamber, 110. Referring now to FIG. 3C, after the silicon substrate, 10, has been placed in the chamber, 110, a vacuum is created in the chamber, 110. For example, a mechanical pump may be used to reduce the pressure in the chamber to $10^{-3}$–$10^{-4}$ Torr. A cryogenic or turbo pump then reduces the pressure to $10^{-6}$–$10^{-9}$ Torr. After the pressure has been reduced to $10^{-6}$–$10^{-9}$ Torr, argon (Ar) is introduced into the chamber, 110, through line, 111. The Ar pressure is maintained at approximately 1–20 mTorr during the deposition process. The Ar is then ignited forming a plasma of $Ar^+$ ions, 112. The target, 113, is made of cobalt and can be either a sputtering gun or a planar magnetron target. During deposition, the target, 113, is biased negatively, causing positively charged $Ar^+$ ions to bombard the target, 113. The positively charged $Ar^+$ ions knock target atoms from the target, 113, which are then propelled towards the substrate, 10. Typical sputtering conditions require that the Ar gas flow be in the range of 20–50 SCCM (Standard Cubic Centimeters Minute), preferably 30 SCCM. The plasma, 112, in chamber, 110, is created by applying a voltage across the target, 113, at a power level between 200–1500 W at a temperature varying between room temperature and 300° C. These conditions will create an acceptable Co layer, 402, between 50 Å–200 Å thick, with a preferred thickness of 120 Å.

Figure 3D:
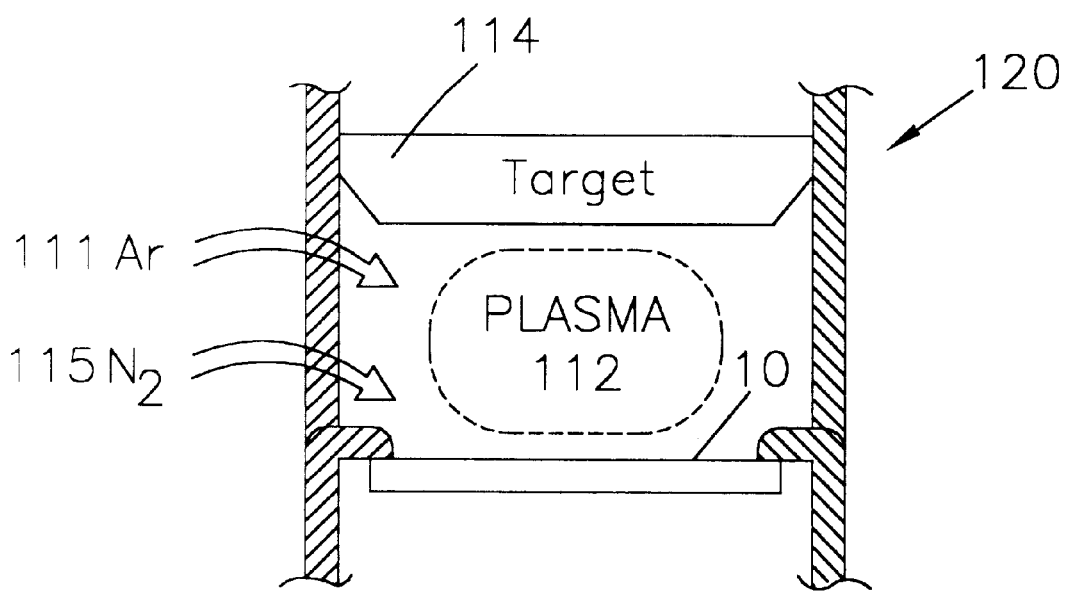
Figure 4:
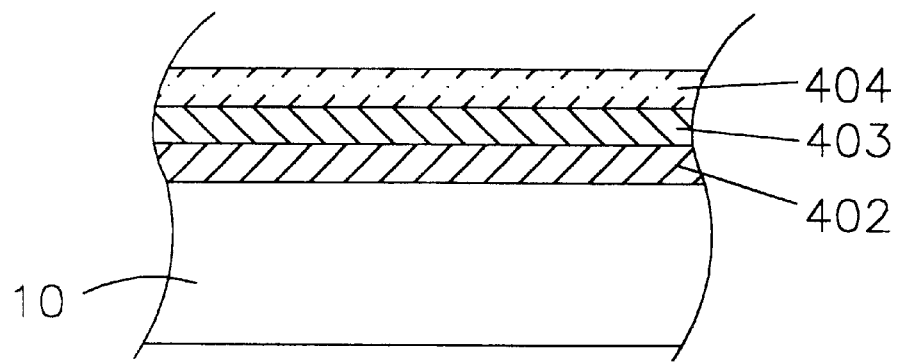
FIGS. 4 through 7 are cross-sectional views of a semiconductor substrate showing the fabrication of a cobalt disilicide layer on a silicon substrate by the method of the present invention.

Referring to FIGS. 3A & 4, in Step 2, after the Co is sputtered, the wafer, 10, is transferred to another chamber, 120. FIG. 3D shows a cross-section view of chamber, 120, which has a target, 114, comprised of pure titanium (Ti) metal. Once the substrate, 10, has been placed in the chamber, 120, a vacuum is created. Typically, a mechanical pump is used to reduce the pressure in the chamber to $10^{-3}$–$10^{-4}$ Torr. A cryogenic or turbo pump then reduces the pressure to $10^{-6}$–$10^{-9}$ Torr. After the pressure has been reduced to $10^{-6}$–$10^{-9}$ Torr, Ar is introduced into the chamber, 120, through line, 111. Nitrogen ($N_2$) gas is then introduced into the sputtering chamber using line, 115. $N_2$ gas can form about 20% to about 70% of the gas in the chamber, 120. $N_2$ gas flow of 50–200 SCCM is suitable, with Ar flow set in the range of about 30–90 SCCM, preferably 34 SCCM. The pressure is maintained at approximately 1–20 mTorr during deposition process. Plasma, 112, is ignited by applying approximately 6000 W through the Ti target, 114, at a temperature between about room temperature and 300° C. Still referring to FIG. 3D, the titanium target, 114, is sputtered in the presence of $N_2$ gas so that the titanium reacts with the $N_2$ gas to form titanium nitride (TiN), which is deposited in a TiN layer, 403, on top of the previously sputtered cobalt layer, 402.

Referring again to FIGS. 3A & 4, in Step 3, a layer of metallic Ti, 404, is formed over the TiN layer, 404. This may be done a number of ways. The wafer, 10, may be moved to a third chamber, 130, where a Ti target may be used to sputter a metallic Ti layer, 404, onto said TiN layer, 403. An abrupt transition between the titanium capping layer, 404, and the titanium nitride capping layer, 403, may be achieved using the third chamber, 130. The target, 114, is the same as shown in FIG. 3D, prior to TiN deposition. The target, 114, is a metallic Ti target. Ar is introduced (through line 111) into the chamber, 130, at a rate of approximately 5–45 SCCM. The plasma is ignited, using between 500–5000 W power at a temperature of between room temperature and 300° C. This allows the deposition of 100% Ti layer, 404, onto the titanium nitride layer, 403, from the start.

Alternatively, the Ti layer, 404, may be deposited over the TiN layer, 403, using a "single-chamber" process. Referring to FIGS. 3B & 4, Steps 1 and 2 are the same as shown and described in FIG. 3A. Unlike Step 3 of FIG. 3A, Step 3 of FIG. 3B does not require a third chamber, 130. Referring to FIGS. 3B & 3D, after the TiN deposition Step 2, the wafer, 10, is not moved to the third chamber, 130. Rather the wafer, 10, remains in the second chamber, 120. In Step 3 of FIG. 3B, after forming the TiN layer, 403, the $N_2$ gas is evacuated from the chamber, 120. Ar is then introduced (through line 111) into the chamber, 120, at a rate of approximately 5–45 SCCM. The plasma is ignited, using between 500–5000 W power at a temperature of between room temperature and 300° C. This allows the deposition of a Ti layer, 404, onto the TiN layer, 403. It can be appreciated that although the FIG. 4 shows a sharp transition between the titanium capping layer, 404, and the titanium nitride capping layer, 403, in actuality, the transition between these layers is gradual as the titanium nitride is slowly sputtered off the target, 114, until pure titanium is reached. The capping layer, 404, will gradually go from 100% titanium nitride to 100% titanium. In the preferred embodiment the titanium layer is approximately 300 Å thick. However, the titanium layer can be between 50 Å and 500 Å thick.

Figure 5:
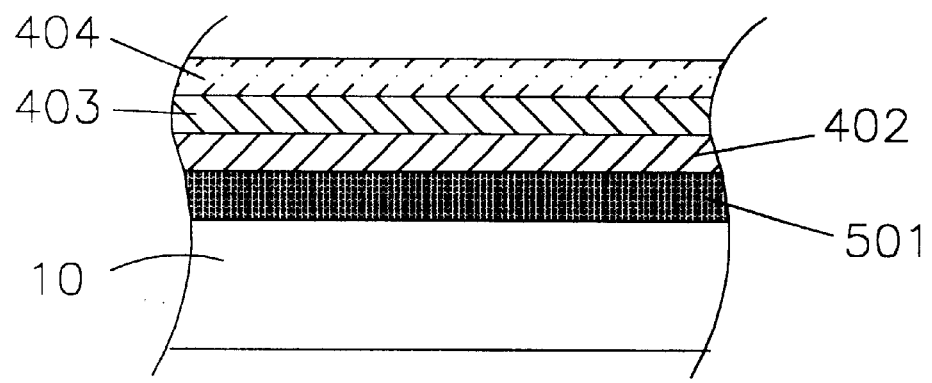

FIG. 4 shows a sectional view of a typical wafer, 10. Typical wafers, 10, are formed of silicon. The sputtering Step 2, disclosed in FIGS. 3A & 3C form the cobalt layer, 402, to a thickness of between 50 Å and 250 Å, with a preferred thickness of 120 Å. Sputtering is also used to form a titanium nitride capping layer, 403. After the titanium nitride capping layer, 403, is formed to a thickness between 100 and 500 Å, preferably 200 Å thick, sputtering is stopped. The second Ti capping layer, 404, is subsequently formed in a one or two chamber process. In the preferred embodiment the titanium layer is approximately 300 Å thick. However, the titanium layer can be between 50 Å and 500 Å thick. Step 4 of FIGS. 3A & 3B is an annealing process. FIGS. 4 and 5 show the surface of a wafer, 10, with a semiconductor substrate after the deposition of a cobalt layer, 402, a titanium nitride layer, 403, and a titanium layer, 404. After formation of these layers, the substrate shown in FIG. 4 is moved to a thermal processing system. Step 4 subjects the wafer, 10, to a rapid thermal anneal ("RTA") using a rapid thermal processing system such as those manufactured by AG Associates or Applied Materials. Alternatively, a conventional furnace with precise oxygen ambient control may be used. The annealing process takes place in two phases.

The first phase (RTA1) uses a rapid thermal anneal process system for 10–90 seconds at 400–600° C., preferably for 60 seconds at 550° C., in a $N_2$ ambient. As shown in FIG. 5, under the conditions of RTA1 the cobalt layer, 402, reacts with the silicon layer, 10, to form CoSi, 501. The capping layers of titanium, 404, and titanium nitride, 403, rest on a layer of unreacted cobalt, 402. After RTA1, the wafer, 10, is subjected to a selective etch using, for example, ammonium peroxide mix in an exemplar volumetric ratio of $H_2O_2:NH_4OH:H_2O$ of approximately 2:1:1. This removes the Ti layer, 404 and the TiN, 403. Another alternative is to use sulfuric acid peroxide mix which will strip the metallic layers from the CoSi underlayer. Etching is carried out at a temperature between room temperature and 120° C. for a time in the range of 5–200 minutes. These etches are selective and will remove the titanium, titanium nitride, and the unreacted cobalt while leaving the CoSi layer, 501, intact.

Figure 6:
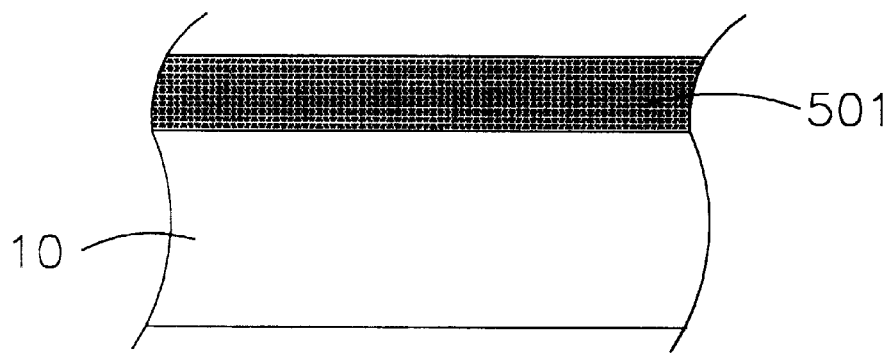
Figure 7:
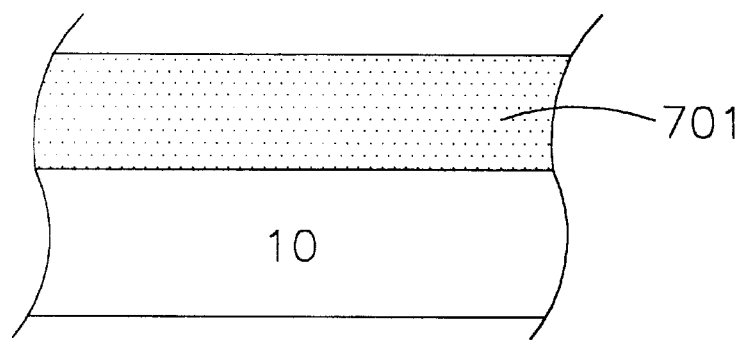

FIGS. 6 & 7 depict the wafer, 10, after the etching, leaving a silicon substrate, 10, with a CoSi layer, 501. Subsequently, a second RTA (RTA2) is performed in ambient $N_2$. The preferred method uses a rapid thermal processor at a temperature between 700 and 850° C. for 10–90 seconds. Most preferably for 60 seconds at 800° C. RTA2 converts the CoSi into a $CoSi_2$ layer, 701. This results in a further consumption of the underlying silicon layer, 10.

It will be appreciated that the present invention is completely compatible with salicide technology and can be practiced on numerous devices, such as MOS transistors and CMOS transistors, as well as on numerous device regions, such as contact fill, floating gate, double polysilicon stacked floating gate, and local interconnects. It is anticipated that the $CoSi_2$ layer formed by the present invention will be useful in the formation of device interconnects having narrow linewidths and in the formation of three dimensional or vertical devices. Additionally, the $CoSi_2$ of the present invention can be used with salicide technology, as described below in conjunction with FIGS. 8 through 14.

Figure 8:
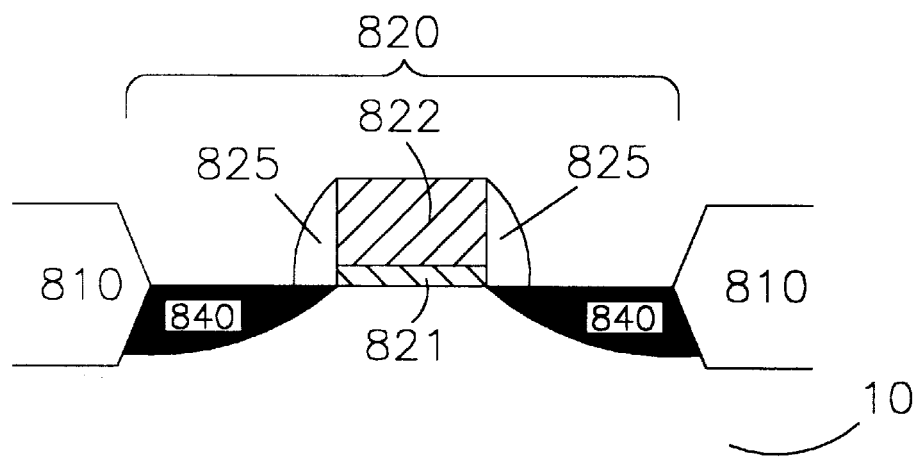
FIGS. 8 through 14 are cross-section views of a semiconductor substrate showing a salicide process of the present invention.

The present invention may be used as a contact metallurgy and is particularly advantageous when used in the fabrication of transistors having gates of about 0.20 μm or smaller. FIGS. 8–14 show the application of the present invention to a MOS transistor. FIG. 8 shows a typical MOS transistor, 820, on a silicon substrate, 10. A gate, 822, and the active region lie between two field oxide regions, 810. Typical field oxide regions, 810, are formed of silicon dioxide. The gate oxide, 821, may also be made of silicon dioxide. The gate electrode, 822, is formed typically of polysilicon. Regions, 840, are transistor source and drain regions. The gate electrode, 822, and the source and drain regions, 840, are all exposed silicon surfaces. On either side of the gate oxide, 821, and the gate electrode, 822, are spacers, 825, which are typically formed of silicon dioxide or silicon nitride. The foregoing structure may be formed using ordinary process methods.

Figure 9:
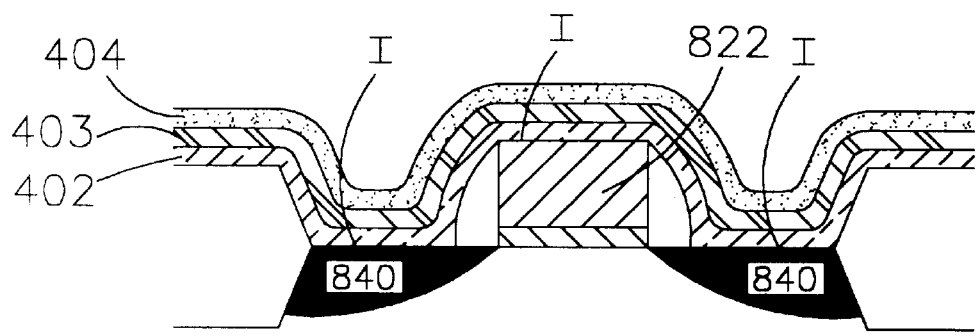

FIG. 9 depicts the structure shown in FIG. 8 after layers of metallic cobalt, 402, titanium nitride, 403, and titanium, 404, are formed thereon. These layers (402, 403, 404) may be formed by the methods described above. The cobalt layer, 402, forms interface regions, I, with the silicon surfaces of the gate, 822, and the source/drain regions, 840.

Figure 10:
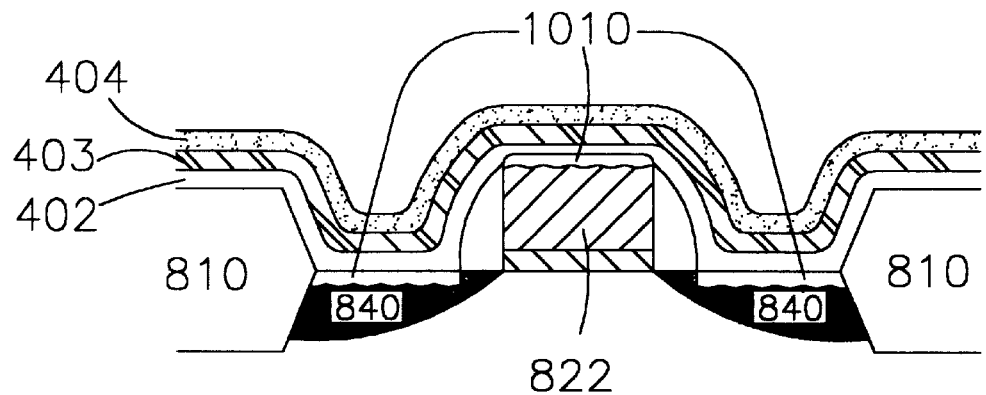
Figure 11:
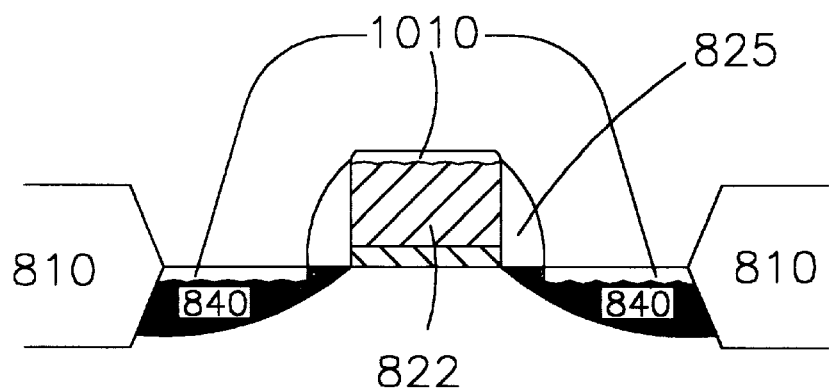

The structure of FIG. 9 is then processed through RTA1 using the same conditions and parameters as disclosed above. As shown in FIG. 10, after RTA1, the interfaces, I, between the cobalt layer, 402, and the silicon of the gate, 822, and the silicon of the source/drain regions, 840, will have formed a cobalt monosilicide (CoSi) layer, 1010, as shown in FIG. 10. The reaction between cobalt and silicon only takes place on exposed silicon surfaces. Thus, no CoSi is formed on the unexposed Si surfaces, for example, those lying underneath the spacers, 825, or the field oxide regions, 810. Some of the silicon in regions, 822 & 840, is consumed in the fabrication of a CoSi layer, 1010. After the RTA1, the structure shown in FIG. 10 then undergoes selective etching to strip the titanium, 404, titanium nitride, 403, and unreacted cobalt, 402, layers.

The remaining metals (cobalt, titanium, and titanium nitride are selectively etched using a $NH_4OH$ solution and an $H_2SO_4$ solution. After etching, a profile similar to that shown in FIG. 11 remains. The etches are selective in that they remove all unreacted cobalt, titanium, and titanium nitride without affecting the $SiO_2$ field oxide, 810, or the spacers, 825, (which are typically formed of $SiO_2$, $Si_3N_4$, or silicon oxynitride material) and more importantly, do not etch the CoSi, 1010, formed on the gate, 822, source and drain regions, 840. After etching the substrate is subject to a second annealing process (RTA2) in a $N_2$ ambient. As explained above, the purpose of this second annealing phase is to convert the CoSi layer, 1010, to highly conductive cobalt disilicide ($CoSi_2$). RTA2 further reacts the CoSi, consuming silicon in the gate, 822, source and drain regions, 840, leaving structures similar to that depicted in FIG. 12. The $CoSi_2$ layer, 1010$g$, over the polysilicon gate material, 822, may be used to form a floating gate. Also, the $CoSi_2$ layer, 1010$d$, in the source and drain regions, 840, can be used as an initial fill for a subsequent contact fill step.

Figure 12:
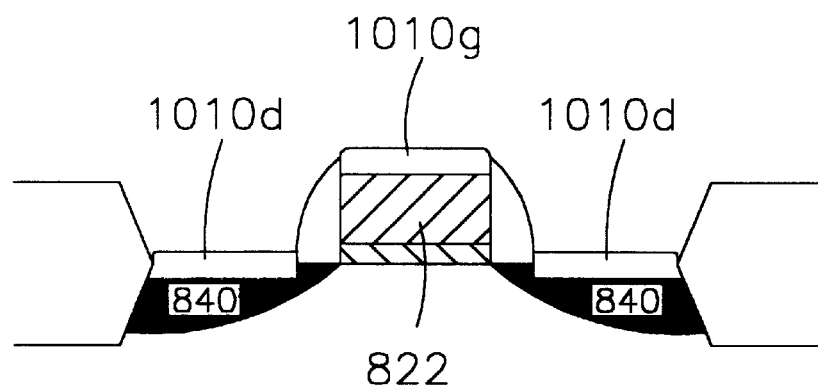
Figure 13:
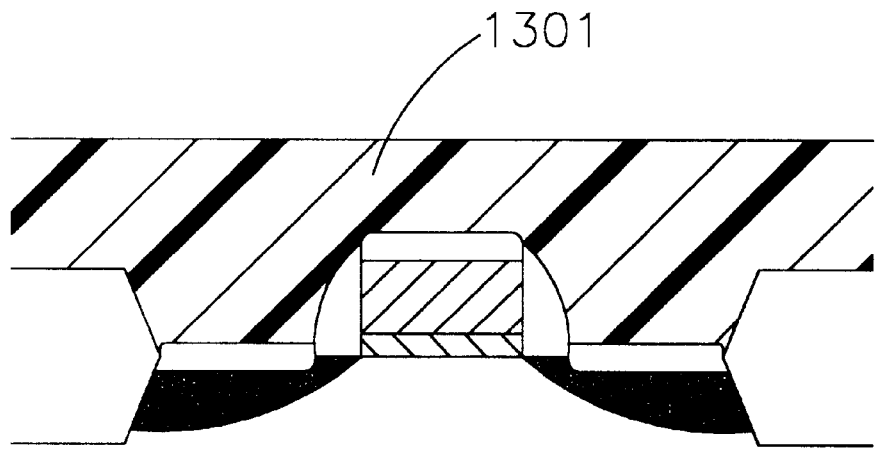
Figure 14:
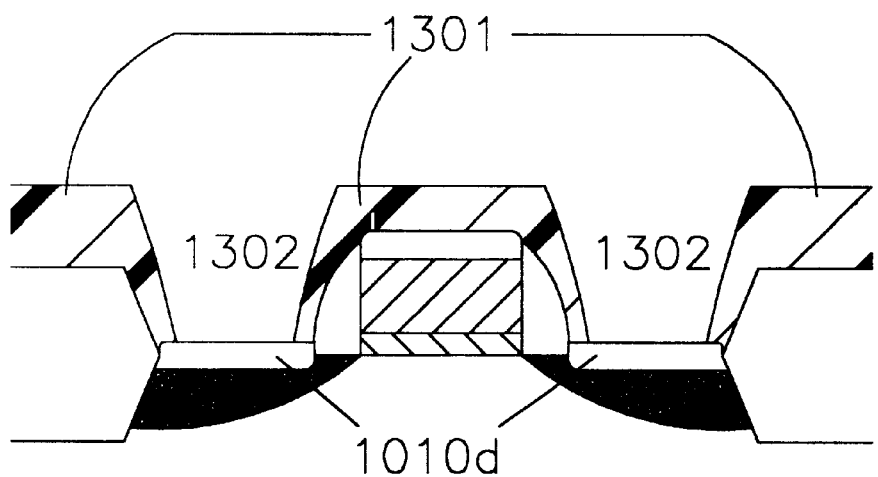

FIG. 13 depicts the structure shown in FIG. 12 after the fabrication of a passivation layer, 1301. The passivation layer, 1301, may be made of a variety of dielectric materials, for example, silicon dioxide or boropolysilicate glass (BPSG). The passivation layer is then masked and etched to expose those regions where contact vias are to be made. FIG. 14 shows the structure of FIG. 13 after the passivation layer, 1301, has been etched to form vias, 1302. The result is that vias, 1302, are formed in the passivation layer, 1301, exposing the $CoSi_2$ layer overlying the source/drain regions, 1010$d$, or optionally gate regions, 1010$g$. The vias, 1302, are filled with conducting materials in order to make electrical contact with the device regions 1010$d$. Ideally the material used to fill the via, 1302, provides a specific contact resistivity of less than $10^{-6}$ to $10^{-8}$ ohms $cm^2$. Typical examples are polysilicon, doped polysilicon, tungsten, aluminum, copper, and copper alloys.

The present invention has been particularly shown and described with respect to certain preferred embodiments and features thereof. However, it should be readily apparent to those of ordinary skill in the art that various changes and modifications in form and detail may be made without departing from the spirit and scope of the invention as set forth in the appended claims. In particular, the use of the present invention to form cobalt silicide local circuit interconnects, floating gates, and double polysilicon stacked floating gates, is specifically contemplated. Furthermore, it is contemplated that the invention be used to form contact surfaces between silicon contact areas and metal. The invention disclosed herein may be practiced without any element not specifically disclosed herein.

We claim:

1. A process for forming a cobalt disilicide layer on a silicon substrate comprising the steps of:

forming on said silicon substrate, a first layer comprising a metallic cobalt material;

forming on said cobalt layer, a second layer comprising a titanium nitride material;

forming on said titanium nitride layer, a third layer comprising a metallic titanium material; and performing a plurality of annealing steps to form a cobalt disilicide layer.

2. A process as in claim 1, wherein said plurality of annealling steps comprise the steps of:

performing a first anneal of said substrate to form a cobalt monosilicide layer disposed above said silicon substrate;

stripping said layers of metallic cobalt material, titanium nitride material, and metallic titanium material, leaving said layer of cobalt monosilicide; and performing a second anneal of said substrate whereby said cobalt monosilicide layer undergoes further reaction to form a cobalt disilicide layer.

3. A process as in claim 2, wherein said first anneal is a rapid thermal anneal or a furnace anneal process and said second anneal is a rapid thermal anneal process or a furnace anneal process.

4. A process as in claim 2, wherein said first anneal is a rapid thermal anneal performed at a temperature in the range of 400–600 degrees Celsius and for a length of time in the range of 10–90 seconds and said second anneal is a rapid thermal anneal performed at a temperature in the range of 700–850 degrees Celsius and for a length of time in the range of 10–90 seconds.

5. A process as in claim 2, wherein said cobalt layer has a thickness in the range of 50–250 Ångstroms and said titanium nitride layer has a thickness in the range of 100–500 Ångstroms and said titanium layer has a thickness in the range of 50–500 Ångstroms.

6. A process as in claim 5, wherein said first anneal is a rapid thermal anneal performed at a temperature in the range of 400–600 degrees Celsius and for a length of time in the range of 10–90 seconds and said second anneal is a rapid thermal anneal performed at a temperature in the range of 700–850 degrees Celsius and for a length of time in the range of 10–90 seconds.

7. A process as in claim 1, wherein said first, second, and third layers are formed using deposition.

8. A process as in claim 7, wherein said steps of depositing said first, second, and third layers comprise depositing said first, second, and third layers in three separate sputtering chambers.

9. A process as in claim 8, wherein said steps of depositing said second and third layers comprise depositing said second and third layers in a single sputtering chamber.

10. A process for forming a cobalt disilicide layer on exposed silicon regions of a silicon substrate comprising the steps of:

providing a silicon substrate having exposed and unexposed silicon regions;

depositing on said silicon substrate a first layer comprising a metallic cobalt material;

depositing on said cobalt layer a second layer comprising a titanium nitride material;

depositing on said titanium nitride layer a third layer comprising a metallic titanium material;

performing a plurality of annealling steps to form a cobalt disilicide layer disposed above said exposed silicon regions.

11. A process as in claim 10, wherein said plurality of annealling steps comprise the steps of:

performing a first anneal of said substrate in a nitrogen gas to form a cobalt monosilicide layer disposed above said exposed silicon regions;

etching to remove said layers of unreacted metallic cobalt material, titanium nitride material, and metallic titanium material from all regions, leaving said layer of cobalt monosilicide; and performing a second anneal of said substrate whereby said cobalt monosilicide layer undergoes further reaction to form a cobalt disilicide layer disposed above said exposed silicon regions.

12. A process as in claim 11, wherein said first anneal is a rapid thermal anneal or a furnace anneal process and said second anneal is a rapid thermal anneal process or a furnace anneal process.

13. A process as in claim 12, wherein said first anneal is a rapid thermal anneal performed at a temperature in the range of 400–600 degrees Celsius and for a length of time in the range of 10–90 seconds and said second anneal is a rapid thermal anneal performed at a temperature in the range of 700–850 degrees Celsius and for a length of time in the range of 10–90 seconds.

14. A process as in claim 10, wherein said steps of depositing said first, second, and third layers comprise depositing said first, second, and third layers in three separate chambers.

15. A process as in claim 10, wherein said steps of depositing said second and third layers comprise depositing said second and third layers in a single chamber.

16. A process as in claim 10, wherein said cobalt layer has a thickness in the range of 50–250 Ångstroms and said titanium nitride layer has a thickness in the range of 100–500 Ångstroms and said titanium layer has a thickness in the range of 50–500 Ångstroms.

17. A process as in claim 16, wherein said first anneal is a rapid thermal anneal performed at a temperature in the range of 400–600 degrees Celsius and for a length of time in the range of 10–90 seconds and said second anneal is a rapid thermal anneal performed at a temperature in the range of 700–850 degrees Celsius and for a length of time in the range of 10–90 seconds.

18. A method for forming a polycrystalline cobalt disilicide structure on a metal oxide transistor in a silicon substrate, comprising the steps of:

providing a silicon substrate having a transistor formed thereon, said transistor having gate, source, and drain regions, said gate having a length dimension of about 0.20 µm or less;

depositing a layer of cobalt on said substrate;

thereafter depositing a layer of titanium nitride on said cobalt layer;

thereafter depositing a layer of titanium on said titanium nitride layer;

thereafter heating said substrate to form a polycrystalline cobalt disilicide layer on said source, gate, and drain regions of said transistor, said heating step comprising a first heating step and a second heating step, said second heating step being performed at a higher temperature than said first heating step; and selectively etching, in between said first and second heating steps, to strip the remaining nonsilicide cobalt, titanium, and titanium nitride material from said substrate except in said gate, source, and drain regions.

19. A process for forming cobalt disilicide contacts on a semiconductor device comprising the steps of:

providing a semiconductor substrate, said substrate having a microcircuit structure with silicon contact areas formed thereon;

depositing a metallic cobalt layer onto said silicon substrate;

depositing a titanium nitride layer onto said cobalt layer;

depositing a metallic titanium layer onto said titanium nitride layer;

performing a first anneal of said substrate whereby the contact areas and some of said cobalt layer react to form a cobalt monosilicide layer disposed above said contact areas;

stripping said layers of metallic cobalt material, titanium nitride material, and metallic titanium material, leaving said cobalt monosilicide disposed above said contact areas; and performing a second anneal of said substrate whereby said cobalt monosilicide layer undergoes further reaction to form cobalt disilicide contacts disposed above said contact areas.

20. A process for forming fill structures leading to cobalt disilicide contacts, comprising the steps of:

providing a semiconductor substrate having contact regions;

depositing on said silicon substrate a first layer comprising a metallic cobalt material;

depositing on said cobalt layer a second layer comprising a titanium nitride material;

depositing on said titanium nitride layer a third layer comprising a metallic titanium material;

performing a first anneal of said substrate, said first annealling forming cobalt monosilicide regions disposed above said contact regions;

stripping said layers of unreacted metallic cobalt material, titanium nitride material, and metallic titanium material, leaving the cobalt monosilicide regions in place;

performing a second anneal of said substrate whereby said cobalt monosilicide undergoes further reaction to form cobalt disilicide contacts disposed above said contact regions;

forming a passivation layer over said substrate, said passivation layer having vias disposed above said cobalt disilicide contacts; and filling said vias with a conducting fill material.

21. A process as in claim 20, wherein said second annealling step to form a cobalt disilicide layer is performed at a higher temperature than said first annealling step.

22. A process as in claim 21, wherein said first anneal is a rapid thermal anneal or a furnace anneal process and said second anneal is a rapid thermal anneal process or a furnace anneal process.

23. A process as in claim 21, wherein said first anneal is a rapid thermal anneal performed at a temperature in the range of 400–600 degrees Celsius and for a length of time in the range of 10–90 seconds and said second anneal is a rapid thermal anneal performed at a temperature in the range of 700–850 degrees Celsius and for a length of time in the range of 10–90 seconds.

24. A process as in claim 21, wherein said first anneal is a rapid thermal anneal or a furnace anneal process and said second anneal is a rapid thermal anneal process or a furnace anneal process.

25. A process as in claim 20, wherein said steps of depositing said first, second, and third layers comprise depositing said first, second, and third layers in three separate chambers.

26. A process as in claim 20, wherein said steps of depositing said second and third layers comprise depositing said second and third layers in a single chamber.

27. A process as in claim 20, wherein said cobalt layer is deposited to a thickness in the range of 50–250 Ångstroms and said titanium nitride layer is deposited to a thickness in the range of 100–500 Ångstroms and said titanium layer is deposited to a thickness in the range of 50–500 Ångstroms.

28. A process as in claim 27, wherein said first anneal is a rapid thermal anneal performed at a temperature in the range of 400–600 degrees Celsius and for a length of time in the range of 10–90 seconds and said second anneal is a rapid thermal anneal performed at a temperature in the range of 700–850 degrees Celsius and for a length of time in the range of 10–90 seconds.

29. A process as in claim 20 wherein said conducting fill material is selected from the group consisting of polysilicon, doped polysilicon, tungsten, aluminum, copper, and copper alloys.

\* \* \* \* \*